United States Patent [19]

Morishita et al.

[11] 4,377,630
[45] Mar. 22, 1983

[54] PHOTOSENSITIVE COMPOSITION

[75] Inventors: Hajime Morishita, Tokyo; Takahiro Kohashi, Hachioji; Saburo Nonogaki; Motoo Akagi, both of Tokyo; Nobuaki Hayashi; Shoichi Uchino, both of Hachioji, all of Japan

[73] Assignee: Hitachi, Ltd., Tokyo, Japan

[21] Appl. No.: 279,849

[22] Filed: Jul. 2, 1981

[30] Foreign Application Priority Data

Jul. 4, 1980 [JP] Japan .................................. 55-90650
Jun. 5, 1981 [JP] Japan .................................. 56-85719

[51] Int. Cl.³ .............................................. G03C 1/60
[52] U.S. Cl. ..................................... 430/176; 430/28; 430/144; 430/179
[58] Field of Search ............... 430/179, 176, 144, 146, 430/151, 28; 427/146, 148, 150, 54.1; 250/316.1, 317.1; 260/142; 8/451, 639, 664, 665, DIG. 12

[56] References Cited

U.S. PATENT DOCUMENTS

| | | | |
|---|---|---|---|
| 2,214,559 | 9/1940 | Lecher et al. | 8/664 |
| 2,405,523 | 8/1946 | Sease et al. | 430/179 |
| 2,593,911 | 4/1952 | Neumann et al. | 430/179 |
| 2,877,083 | 3/1959 | Streck | 8/664 |
| 3,202,510 | 8/1965 | Hollmann | 430/176 |
| 3,230,257 | 1/1966 | Schmerling | 430/171 |
| 3,469,984 | 9/1969 | Bialczak | 430/151 |
| 3,501,453 | 3/1970 | Steinemann | 260/142 |
| 3,704,129 | 11/1972 | deBoer et al. | 430/179 |
| 4,110,071 | 8/1978 | Schaub et al. | 8/664 |
| 4,273,842 | 6/1981 | Nonogaki et al. | 430/179 |

*Primary Examiner*—Charles L. Bowers, Jr.
*Attorney, Agent, or Firm*—Antonelli, Terry & Wands

[57] ABSTRACT

A photosensitive composition improved in sensitivity by adding a salt of a compound represented by the general formula:

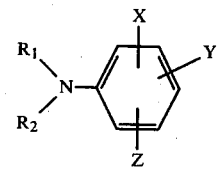

(wherein $R_1$ and $R_2$ each represents a straight chain alkyl group, and X, Y and Z each represents H, a straight chain alkyl group or an alkoxy group, but two or more of X, Y and Z can not be H at the same time) to an aromatic diazonium salt which gets sticky upon exposure to light.

19 Claims, No Drawings

PHOTOSENSITIVE COMPOSITION

BACKGROUND OF THE INVENTION

This invention relates to a photosensitive composition and a pattern forming process using such composition.

The interior side of the face plate of the color picture tube is coated with three different kinds of phosphor in dots or in stripes. This phosphor coat layer is formed in the following way. First, a mixed coating material composed of a phosphor for the first color and a photosensitive resin is applied on the interior side of the face plate and dried to form a coating film, and this layer is irradiated with ultraviolet rays through the holes in a shadow mask. The ultraviolet rays are irradiated to the position where the electron beams for effecting emission of light from the phosphor hit, that is, the place where said phosphor is to be attached. The photosensitive resin at the irradiated portion is insolubilized, resulting in insolubilization of the entire layer in that portion. Then the layer is washed with a solvent, retaining the insolubilized portion alone on the face plate while removing the other portion of the layer by dissolution. Then the same operation as said above is performed with the layer formed from a mixture of a phosphor for the second color and a photosensitive resin, and this is followed by the same operation by using a mixture of a phosphor for the third color and a photosensitive resin.

As appreciated from the foregoing explanation, the color picture tube phosphor surface forming process is complicated, and multiple times of repetition of wet coating, water washing and drying are required, so that simplification of such process is quite desirable.

As an improvement on such process, some of the present inventors have previously proposed, in Japanese Laid-Open Patent Application No. 126861/78, a method of forming the color picture tube phosphor surface in a considerably simpler manner than the prior art. This method was attained on the basis of a new finding that the photolytic product of an aromatic diazonium salt has an ability to accept powder particles, and it is characterized by (1) coating the inner surface of the face plate of a color picture tube with a photosensitive composition containing an aromatic diazonium salt as a photosensitive component and getting sticky by light exposure, thereby forming a thin coating layer on said surface, (2) subjecting said thin layer to patternwise exposure to make the exposed portion sticky, and (3) contacting the powder particles with the exposed thin layer to have said powder particles accepted by said thin layer.

According to this method, mere repetition of exposure and powder contact is required for the phosphors of the second and third colors, and when the coating film is once formed, it is possible to form as many phosphor patterns as desired. It is also possible to produce a black matrix by using powder of a light-absorbing material such as, for example, carbon powder.

This method, however, has a drawback that the processing time is rather long due to a somewhat lower sensitivity of the photosensitive component than the conventional photosensitive resins.

On the other hand, the following references are also known to show the state of the art: British Pat. Nos. 1,103,864 and 1,103,865.

SUMMARY OF THE INVENTION

An object of the present invention is to provide a process for forming a pattern with said aromatic diazonium salt and a highly sensitive composition used in such process.

Another object of the present invention is to provide a photosensitive composition containing a salt of a compound represented by the general formula:

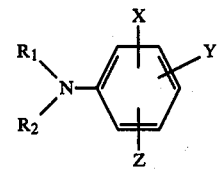

(wherein $R_1$ and $R_2$ are each a straight chain alkyl group, X, Y and Z are each H, a straight chain alkyl group or an alkoxy group, but two or more of X, Y and Z can not be H at the same time) and an aromatic diazonium salt which gets sticky upon light exposure, and a process for forming a pattern by using such composition.

DETAILED DESCRIPTION OF PREFERRED EMBODIMENTS

The salt of a compound represented by the above-shown general formula is preferably a hydrochloride-zinc chloride double salt. This is due to the following reason. As mentioned in said Japanese Laid-Open Patent Application No. 126861/78, if the coating film containing the photosensitive component remains non-crystallized, powder might deposit at the non-exposed part, too, when the powder is contacted with the coating film, so that the coating film needs be crystallized. As for the aromatic diazonium salt used as photosensitive component, it is desirable to employ a diazonium chloride-zinc chloride double salt because of its excellent crystallinity and high rate of powder deposition. Said aromatic diazonium salt and a salt of a compound of the above-shown general formula (hereinafter referred to as additive) are formed into a solution and such solution is applied on a substrate and dried to form a coating film. Thus, since two different salts exist in the solution, it is preferable that they are anions of the same type, and for this reason, it is desirable that the additive is a double salt with zinc chloride. Further, in crystallinity of the additive itself, a hydrochloride-zinc chloride double salt is more advantageous than other types of salt. It is of course possible to use other salts such as tin salt, calcium salt or iron salt.

$R_1$ and $R_2$ in the shown general formula are preferably a methyl group or an ethyl group as they provide excellent crystallinity of the additive itself. Methyl group is most preferred because of particularly high crystallinity.

The alkyl group and alkoxy group represented by X, Y and Z preferably have not more than 2 carbon atoms for the same reason as said above (excellent crystallinity). Use of a substituent having 3 or more carbon atoms can produce the same sensitizing effect as provided when using said group having not more than 2 carbon atoms, but in this case, crystallinity of the coating film formed is deteriorated, so that it is preferable to use a group having not more than 2 carbon atoms as said above.

As the examples of such salts of the compounds of the above-shown general formula, there may be cited the following:

2,6-dimethyl-N,N-dimethylaniline hydrochloride zinc chloride double salt

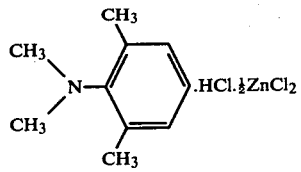
I 3,5-dimethyl-N,N-dimethylaniline hydrochloride zinc chloride double salt

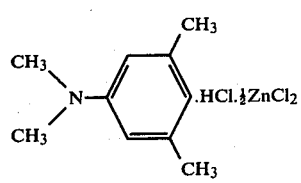
II 2,4,6-trimethyl-N,N-dimethylaniline hydrochloride zinc chloride double salt

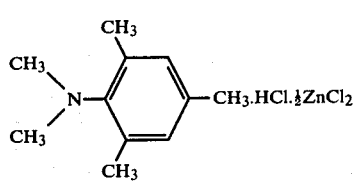
III 2,6-diethyl-N,N-dimethylaniline hydrochloride zinc chloride double salt

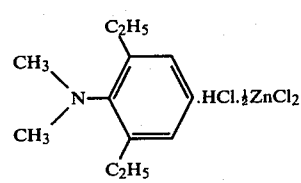
IV 3-methoxy-2,6-dimethyl-N,N-dimethylaniline hydrochloride zinc chloride double salt

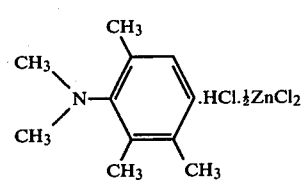
V 3-ethoxy-2,6-dimethyl-N,N-dimethylaniline hydroxhloride zinc chloride double salt

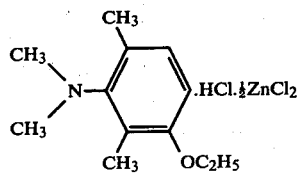
VI 4-methoxy-2,6-dimethyl-N,N-dimethyl-N,N-dimethylaniline hydrochloride zinc chloride double salt

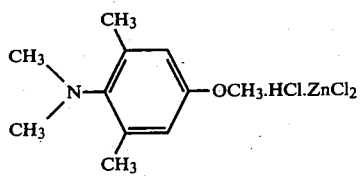
VII 4-ethoxy-2,6-dimethyl-N,N-dimethylaniline hydrochloride zinc chloride double salt

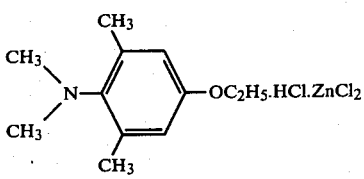
VIII

Among other examples are 3,5-dimethyl-4-ethoxy-N,N-dimethylaniline hydrochloride zinc chloride double salt, 3,5-dimethyl-4-methoxy-N,N-dimethylaniline hydrochloride zinc chloride double salt, and 3,4,5-trimethoxy-N,N-dimethylaniline hydrochloride zinc chloride double salt.

There are known several sensitizers which promote photolysis of diazonium salts, but all of these sensitizers are of the type which merely promotes decomposition of diazonium salts in a solution and such sensitizers show no sensitizing effect in a solid phase state. The additive used in this invention is capable of promoting photolysis of diazonium salt in crystallized solid phase, and no such type of additive has been known to date. Also, the additive of this invention hardly inhibits crystal growth of diazonium salts.

The amount of the additive added is preferably within the range of 300–1 wt%, more preferably 300–5 wt%, based on the weight of the aromatic diazonium salt. Addition of the additive in an amount of 1 wt% or more improves the diazonium salt photolyzing efficiency, and addition in an amount of 5 wt% or more gives a greater improvement of the photolyzing efficiency. On the other hand, addition of the additive in excess of 300 wt% results in a reduced crystallinity of the coating film. Two or more additives may be used in admixture.

As the aromatic diazonium salt constituting the photosensitive component in the composition of this invention, there may be used, for example, those cited in afore-mentioned Japanese Laid-Open Patent Application No. 126861/78 or the novel aromatic diazonium salts disclosed in our separate application. Exemplary of the former are the aromatic diazonium chloride zinc chloride double salts such as 4-(dimethylamino)benzenediazonium chloride zinc chloride double salt, 4-(diethylamino)benzenediazonium chloride zinc chloride double salt, 4-(N-ethyl-N-hydroxyethylamino)benzenediazonium chloride zinc chloride double salt and 4-methoxybenzenediazonium chloride zinc chloride double salt; aromatic diazonium tetrafluoroborates such as 4-(dimethylamino)benzenediazonium borohydrofluoride and 2-methoxybenzenediazonium borohydrofluoride; and aromatic diazonium acidic sulfates such as 4-(dimethylamino)benzenediazonium sulfate, while the latter includes 2-methyl-4-(dimethylamino)benzenediazonium chloride zinc chloride double salt, etc.

Among said salts, zinc chloride double salts are preferred for crystallizing the coating film as said above. It is particularly preferable to use 4-(dimethylamino)benzenediazonium chloride zinc chloride double salt, and in case of using two or more salts in admixture, it is desirable to add said 4-(dimethylamino)-benzenediazonium chloride zinc chloride double salt as one of the salts to be mixed.

It has been already proposed to blend an organic polymer compound and/or a surfactant in the photosensitive component for the purpose of improving coatability when forming a thin layer with the photosensitive component according to this invention, and use of such blended photosensitive component is desirable in this invention, too. The organic polymer compounds recommendable for use in this invention for said purpose include gum arabic, polyvinyl alcohol, polyacrylamide, poly-N-vinylpyrrolidone, hydroxypropylmethyl cellulose, alginic acid, propylene glycol esters of alginic acid, acrylamide-diacetoacrylamide copolymer and methylvinyl ether-maleic anhydride copolymer. These organic polymer compounds are preferably used in an amount of 0.5–500 wt% based on the aromatic diazonium salt. The surfactant is preferably used in an amount of 0.01–1 wt%.

In the present invention, a pattern is formed by applying a solution of said composition on a substrate, drying it to form a coating film, subjecting this coating film to exposure of a predetermined pattern to make the exposed part sticky, then contacting powder with this coating film so that powder deposits at the exposed part while removing the rest of powder by a suitable means such as air spray, and the process after exposure is repeated for the second and third powders. It is thereby possible to form a high-sensitivity pattern with several different kinds of powder.

The powder used in this invention is one having a mean particle size of about 0.01 to about 100 μm. In case of using a phosphor or a pigment-attached phosphor, it is preferable to use powder having a mean particle size of about 4–15 μm. It is more desirable to use a phosphor surface treated with $Zn(OH)_2$ or the like such as shown in a patent application filed separately by a part of the present inventors.

That the thus formed phosphor coating layer can be fixed by contacting it with an alkaline material vapor such as ammonia gas is taught in afore-mentioned Japanese Laid-Open Patent Application No. 126861/78 and other literatures, and such fixing procedures can be employed in this invention as well.

It is also possible to use the fixing method shown in Japanese Laid-Open Patent Application No. 32332/80 filed by a part of the present inventors. According to this method, a powdery material which forms a water-insoluble or sparingly water-soluble solid material upon reaction with the product from a photolytic reaction of an aromatic diazonium salt is applied after or during formation of the powder (such as fluorescent substance) coat layer. Therefore, such powdery material for fixing depends on the type of the diazonium salt used. For example, in case the diazonium salt used is a zinc chloride double salt, the photolytic product is zinc chloride, and as the powder material for fixing, there may be used alkali metal hydroxide, alkaline earth metal hydroxide, alkali metal oxide, alkaline earth metal oxide, alkali metal carbonate, bicarbonate or oxalate, ammonium carbonate, ammonium oxalate, etc. In case the diazonium salt is an acidic sulfate, the photolytic product is sulfate, and hence alkaline earth metal hydroxide, alkaline earth metal oxide, alkali metal carbonate, nitrate, acetate, etc., may be used as the powdery material for fixing.

The present invention will be further described below by referring to the Examples thereof.

EXAMPLE 1

50 g of 2,6-dimethylaniline was suspended in 124 cc of water, followed by dropwise addition of 105 g of dimethyl sulfate at a temperature below 20° C. Then 132 g of an aqueous 30% sodium hydroxide solution was added to dimethylize the amino group. The resulting N,N-dimethyl compound was dissolved in hydrochloric acid and added with 4-fold molar amount of zinc chloride to precipitate a double salt. It was recrystallized from dilute hydrochloric acid to obtain the salt of formula I. M.p.: 155°–156° C.; amount of zinc: 12.3% (calculated: 12.9%) (the amount of zinc in this and following Examples was measured by EDTA chelate titration); NMR (chemical shift): 3.3 ppm, 2.5 ppm, 7.2 ppm.

EXAMPLE 2

The same treatment as Example 1 was carried out by using 3,5-dimethylaniline instead of 2,6-dimethylaniline to obtain the salt of formula II. M.p.: 125°–126° C.; amount of zinc: 12.8% (calculated: 12.9%); NMR (chemical shift): 3.2 ppm, 2.3 ppm, 7.2 ppm.

EXAMPLE 3

The same treatment as Example 1 was carried out by using 2,4,6-trimethylaniline to obtain the salt of formula III. M.p.: 187°–189° C.; amount of zinc: 12.1% (calculated: 12.2%); NMR (chemical shift): 2.8 ppm, 2.1 ppm, 2.0 ppm, 6.6 ppm.

EXAMPLE 4

2,6-diethylaniline was suspended in water and added dropwise with dimethyl sulfate at room temperature to effect dimethylation, and the solution was distilled to obtain 2,6-diethyl-N,N-dimethylaniline. This was dissolved in a hydrochloric acid solution and admixed with zinc chloride to synthesize 2,6-diethyl-N,N-dimethylaniline hydrochloride zinc chloride double salt of formula IV. Amount of zinc: 11.6% (calculated: 11.5%); infrared absorption spectra (KBr tablet method): 3070 $cm^{-1}$, 1450 $cm^{-1}$, 1380 $cm^{-1}$, 810 $cm^{-1}$, 560 $cm^{-1}$.

EXAMPLE 5

40 ml of 2,6-dimethyl-N,N-dimethylaniline was dissolved in 88 ml of concentrated sulfuric acid at a temperature below 15° C., followed by dropwise addition of 35 ml of concentrated nitric acid by maintaining the temperature below 15° C. Thereafter, the mixture was reacted for one hour, poured into cold water and then neutralized with sodium carbonate, whereby 3-nitro-2,6-dimethyl-N,N-dimethylaniline was precipitated in the form of crystals. The produced nitro compound was reduced, diazotized and then pyrolyzed to obtain 3-hydroxy-2,6-dimethyl-N,N-dimethylaniline. This phenol compound was dissolved in an alkaline solution and treated with excess dimethyl sulfate at 40°–45° C. The resulting 3-methoxy-2,6-dimethyl-N,N-dimethylaniline was dissolved in hydrochloric acid and then admixed with double molar amount of zinc chloride to precipitate a double salt. It was recrystallized from dilute hydrochloric acid to obtain the salt of formula V. M.p.: 162°–165° C., amount of zinc: 11.8% (calculated: 11.4%); infrared absorption spectra: 3100 cm$^{-1}$, 1450 cm$^{-1}$, 1260 cm$^{-1}$, 1070 cm$^{-1}$, 820 cm$^{-1}$, 1600 cm$^{-1}$; NMR (chemical shift): 3.4 ppm, 3.9 ppm, 2.4 ppm, 2.5 ppm, 7.1 ppm, 7.2 ppm, 7.0 ppm, 7.3 ppm.

EXAMPLE 6

3-hydroxy-2,6-dimethyl-N,N-dimethylaniline obtained in the same way as Example 5 was dissolved in an alkaline solution and admixed dropwise with diethyl sulfate by maintaining the temperature at 50°–60° C. to synthesize 3-ethoxy-2,6-dimethyl-N,N-dimethylaniline. It was dissolved in hydrochloric acid and admixed with double molar amount of zinc chloride to precipitate a double salt. Recrystallization thereof from dilute hydrochloric acid gave the salt of formula VI. M.p.: 164°–165° C.; amount of zinc: 11.1% (calculated: 10.9%); infrared absorption spectra: 3100 cm$^{-1}$, 1610 cm$^{-1}$, 1460 cm$^{-1}$, 1270 cm$^{-1}$, 1070 cm$^{-1}$, 820 cm$^{-1}$; NMR (chemical shift): 3.4 ppm, 2.4 ppm, 2.5 ppm, 1.4 ppm, 1.3 ppm, 1.5 ppm, 4.0 ppm, 4.1 ppm, 3.9 ppm, 4.2 ppm, 7.1 ppm, 7.2 ppm, 6.9 ppm, 7.3 ppm.

EXAMPLE 7

25 g of 3,5-dimethylphenol was dissolved in 200 g of an aqueous 5% sodium hydroxide solution, and in this solution were added and dissolved 1 g of hypo and 20 g of sodium nitrate. Then an aqueous solution formed by dissolving 27 ml of concentrated sulfuric acid in 80 ml of water was added dropwise into the abovesaid solution by maintaining the temperature below 7° C., causing precipitation of 4-nitroso-3,5-dimethylphenol. The obtained nitroso compound was dissolved in an alkaline solution (caustic soda) and admixed dropwise with dimethyl sulfate while maintaining the temperature at 40°–45° C. to effect etherification. Then the nitroso group was reduced to synthesize 4-methoxy-2,6-dimethylaniline. The produced aniline compound was suspended in water and dimethyl sulfate was acted at room temperature to dimethylize the amino group. Resulting 4-methoxy-2,6-dimethyl-N,N-dimethylaniline was dissolved in hydrochloric acid and admixed with double molar amount of zinc chloride to precipitate a double salt. It was recrystallized from dilute hydrochloric acid to obtain the salt of formula VII. M.p.: 45°–47° C.; infrared absorption spectra: 3100 cm$^{-1}$, 1600 cm$^{-1}$, 1460 cm$^{-1}$, 1310 cm$^{-1}$, 1160 cm$^{-1}$, 1060 cm$^{-1}$, 860 cm$^{-1}$; amount of zinc: 17.4% (calculated: 18.4%).

EXAMPLE 8

4-nitroso-3,5-dimethylphenol synthesized after the manner of Example 7 was dissolved in an alkaline solution and admixed dropwise with diethyl sulfate at 50°–60° C. to etherify the phenol. Then the nitroso group was reduced to synthesize 4-ethoxy-2,6-dimethylaniline. This aniline compound was suspended in water and dimethyl sulfate was acted at room temperature to dimethylize the amino group. Resulting 4-ethoxy-2,6-dimethyl-N,N-dimethylaniline was dissolved in hydrochloric acid and admixed with double molar amount of zinc chloride to precipitate a double salt. By recrystallization from dilute hydrochloric acid, the salt of formula VIII was obtained. M.p.: 42°–43° C.; infrared absorption spectra: 3100 cm$^{-1}$, 1600 cm$^{-1}$, 1460 cm$^{-1}$, 1310 cm$^{-1}$, 1160 cm$^{-1}$, 1060 cm$^{-1}$, 840 cm$^{-1}$; amount of zinc: 16.5% (calculated: 17.7%).

EXAMPLE 9

An aqueous solution having a composition comprising 80 g of a 0.5% aqueous solution of a propylene glycol alginate ester which is a water-soluble polymer compound, 3.2 g of 4-(dimethylamino)benzenediazonium chloride zinc chloride double salt used as photosensitive component, 0.7 g of the additive of formula I and 20 g of water was coated on a glass substrate by spin coating to form a 0.5 μm thick photosensitive layer.

This layer was exposed to the ultraviolet rays from a 500 W super-high pressure mercury arc lamp at a distance of 90 cm from said layer through an aperture mask having a predetermined pattern for a period of 63 seconds, and then a phosphor was placed thereon. The phosphor deposited on the irradiated portion alone. Likewise, the second and third phosphors were deposited by the second and third exposure operations.

For the purpose of comparison, the same treatment was performed by using the same photosensitive composition save the additive. In this case, the exposure time required for attaining a sufficient amount of phosphor deposit was 85 seconds.

EXAMPLES 10 and 11

When the amounts of the photosensitive component (diazonium salt) and the additive were changed as shown in Table 1, the exposure time required for giving a sufficient amount of phosphor deposit was as shown in Table 1.

TABLE 1

| Example No. | Photosensitive component (g) | Additive (g) | Exposure time (sec) |
|---|---|---|---|
| 10 | 2.7 | 1.2 | 56 |
| 11 | 2.0 | 1.75 | 50 |

EXAMPLES 12, 13 AND 14

When the same treatments as in Examples 9, 10 and 11 were performed by using the salt of formula II instead of the salt of formula I as additive, the substantially same results were obtained.

EXAMPLE 15

0.7 g of the additive of formula III and 3.2 g of 4-(dimethylamino)benzenediazonium chloride zinc chloride double salt were dissolved in 80 g of a 0.5% aqueous solution of propylene glycol alginate ester, and this solution was further admixed with 20 g of water and then applied on a glass substrate to form a 0.5 μm thick coating film. This coating film was exposed to a 500 W super-high pressure mercury arc lamp from a distance of 90 cm through a mask for a period of 63 seconds, and then a phosphor powder was contacted therewith and the unnecessary phosphor was removed by air spray to obtain a phosphor pattern corresponding to the exposed portion.

EXAMPLE 16

An aqueous solution having a composition comprising 3.2 g of 4-(dimethylamino)benzenediazonium chloride zinc chloride double salt forming the photosensitive component, 0.7 g of the material of formula IV, 80 g of a 0.5% aqueous solution of propylene glycol alginate ester which is a water-soluble polymer compound and 20 g of water was coated on a glass substrate by rotary coating to form a 0.5 μm thick photosensitive layer. This layer was exposed to the ultraviolet rays from a 500 W super-high pressure mercury arc lamp from a distance of 90 cm through an aperture mask having a predetermined pattern for a period of 63 seconds. When a phosphor was applied thereto immediately, said phosphor deposited at the irradiated portion alone.

By way of comparison, the same treatment was conducted by using the same photosensitive composition save said additive. In this case, the exposure time required for providing a sufficient amount of phosphor deposit was 85 seconds.

EXAMPLE 17

An aqueous solution having a composition comprising 80 g of a 0.5% aqueous solution of propylene glycol alginate ester which is a water-soluble polymer compound, 3.3 g of 4-(dimethylamino)benzenediazonium chloride zinc chloride double salt as photosensitive component, 0.33 g of the additive of formula V and 20 g of water was coated on a glass substrate by spin coating to form a 0.5 μm thick photosensitive layer.

This layer was exposed to the ultraviolet rays from a 500 W super-high pressure mercury arc lamp from a distance of 90 cm through an aperture mask having a predetermined pattern for a period of 63 seconds, and then a phosphor was applied thereto, whereby the phosphor was allowed to deposit at the irradiated portion alone. The second and third phosphors were deposited likewise by the second and third exposure operations.

For comparison, the same treatment was performed by using the same photosensitive composition save the additive. In this case, the exposure time required for depositing a sufficient amount of phosphor was 85 seconds.

EXAMPLES 18 AND 19

When the amounts of the diazonium salt (photosensitive component) and the additive were changed as shown in Table 2, the exposure time required for giving a sufficient phosphor deposit was as shown in Table 2.

TABLE 2

| Example No. | Photosensitive component (g) | Additive (g) | Exposure time (sec) |
|---|---|---|---|
| 18 | 3.3 | 0.5 | 56 |
| 19 | 3.3 | 0.7 | 50 |

EXAMPLE 20

0.33 g of the additive of formula VI and 3.3 g of 4-(dimethylamino)benzenediazonium chloride zinc chloride double salt were dissolved in 80 g of a 0.5% aqueous solution of propylene glycol alginate ester, and this solution was further added with 20 g of water and applied on a glass substrate to form a 0.5 μm thick coating film. It was exposed through a mask for 63 seconds by using a 500 W super-high pressure mercury arc lamp from a distance of 90 cm, and then a phosphor powder was contacted therewith and the unnecessary phosphor was removed by air spray to obtain a phosphor pattern corresponding to the exposed part.

EXAMPLE 21

When the same treatment as in Example 17 was carried out by using the additive of formula VII, the substantially same results were obtained.

EXAMPLES 22 AND 23

When the same treatment as in Example 17 was performed by using the additive of formula VIII and changing the amount of said additive to 1% by weight (Example 22) and 5% by weight (Example 23) based on the weight of the photosensitive component, the substantially same results were obtained, with the exposure time required being 81 seconds (Example 22) and 72 seconds (Example 23).

EXAMPLE 24

The same synthesis as in Example 5 was carried out by using 2,6-dimethyl-N,N-diethylaniline to obtain 3-methoxy-2,6-dimethyl-N,N-diethylaniline hydrochloride zinc chloride double salt. When the treatment of Example 17 was repeated by using this double salt, there were obtained the substantially same results.

What is claimed is:

1. A photosensitive composition capable of being applied to a substrate as a film, where light-exposed parts thereof are capable of turning tacky to fix powders thereon, which comprises an aromatic diazonium salt which gets sticky upon exposure to light and a salt of a compound represented by the general formula:

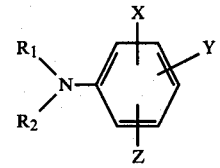

(wherein $R_1$ and $R_2$ each represents a straight chain alkyl group, X, Y and Z each represents H, a straight chain alkyl group or an alkoxy group, but two or more of X, Y and Z can not be H at the same time), wherein the amount of the salt of a compound represented by the general formula is within the range of 300-1% by weight based on the aromatic diazonium salt, whereby said salt of a compound represented by the general formula increases the photolyzing efficiency of said aromatic diazonium salt.

2. The photosensitive composition according to claim 1, wherein $R_1$ and $R_2$ in the above-shown general formula are each a straight chain alkyl group having 2 or less carbon atoms.

3. The photosensitive composition according to claim 2, wherein $R_1$ and $R_2$ in the above-shown general formula are each a methyl group.

4. The photosensitive composition according to any of claims 1, 2 or 3, wherein the straight chain alkyl group represented by one or more of X, Y and Z in the above-shown general formula has two or less carbon atoms.

5. The photosensitive composition according to any of claims 1, 2 or 3, wherein the alkoxy group represented by one or more of X, Y and Z in the above-shown general formula has two or less carbon atoms.

6. The photosensitive composition according to any of claims 1, 2 or 3, wherein the salt of a compound represented by the above-shown general formula is a hydrochloride zinc chloride double salt.

7. The photosensitive composition according to any of claims 1, 2 or 3, wherein the salt of a compound represented by said general formula is a salt of at least one compound selected from the group consisting of 2,6-dimethyl-N,N-dimethylaniline, 3,5-dimethyl-N,N-dimethylaniline, 2,4,6-trimethyl-N,N-dimethylaniline, 2,6-diethyl-N,N-dimethylaniline, 3-methoxy-2,6-dimethyl-N,N-dimethylaniline, 3-ethoxy-2,6-dimethyl-N,N-dimethylaniline, 4-methoxy-2,6-dimethyl-N,N-dimethylaniline and 4-ethoxy-2,6-dimethyl-N,N-dimethylaniline.

8. The photosensitive composition according to claim 7, wherein the salt of a compound represented by the above-shown general formula is a hydrochloride zinc chloride double salt.

9. The photosensitive composition according to any of claims 1, 2 or 3, further containing an organic polymer compound in an amount within the range of 0.5–500% by weight based on the aromatic diazonium salt.

10. The photosensitive composition according to claim 9, wherein the organic polymer compound is at least one member selected from the group consisting of gum arabic, polyvinyl alcohol, polyacrylamide, poly-N-vinylpyrrolidone, hydroxypropylmethyl cellulose, alginic acid, propylene glycol ester of aliginic acid, acrylamide-diacetoneacrylamide copolymer and methylvinyl ether-maleic anhydride copolymer.

11. The photosensitive composition according to claim 1, wherein the salt of a compound represented by said general formula is selected from the group consisting of 3,5-dimethyl-4-ethoxy-N, N-dimethylaniline hydrochloride zinc chloride double salt, 3,5-dimethyl-4-methoxy-N, N-dimethylaniline hydrochloride zinc chloride double salt, and 3,4,5-trimethoxy-N, N-dimethylaniline hydrochloride zinc chloride double salt.

12. The photosensitive composition according to any of claims 1, 2, or 3, wherein said composition is in the solid phase.

13. The photosensitive composition according to claim 12, wherein said solid phase is a crystallized solid phase.

14. The photosensitive composition according to claim 1, wherein the amount of said salt of a compound represented by said general formula is within the range 300–5% by weight based on the aromatic diazonium salt.

15. The photosensitive composition according to claim 6, wherein said aromatic diazonium salt is an aromatic diazonium chloride zinc chloride double salt.

16. The photosensitive composition according to claim 15, wherein said aromatic diazonium chloride zinc chloride double salt is selected from the group consisting of 4-(dimethylamino)benzenediazonium chloride zinc chloride double salt, 4-(diethylamino)benzenediazonium chloride zinc chloride double salt, 4-(N-ethyl-N-hydroxyethylamino)benzenediazonium chloride zinc chloride double salt, 4-methoxybenzenediazonium chloride zinc chloride double salt, and 2-methyl-4-(dimethylamino)benzenediazonium chloride zinc chloride double salt.

17. The photosensitive composition according to claim 15, wherein said aromatic diazonium chloride zinc chloride double salt is 4-(dimethylamino)benzenediazonium chloride zinc chloride double salt.

18. The photosensitive composition according to any of claims 1, 2 or 3, consisting essentially of said aromatic diazonium salt and said salt of a compound represented by the general formula.

19. The photosensitive composition according to any of claims 1, 2 or 3, wherein said salt of a compound represented by the general formula is a hydrochloride-zinc chloride double salt, a tin salt, a calcium salt or an iron salt.

* * * * *